(12) United States Patent
Ersoy et al.

(10) Patent No.: US 7,829,805 B2
(45) Date of Patent: Nov. 9, 2010

(54) SHIFTING DEVICE FOR A MOTOR VEHICLE

(75) Inventors: Metin Ersoy, Walluf (DE); Andreas Gaertner, Bremen (DE); Peter Reitz, Neukirch (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 757 days.

(21) Appl. No.: 11/720,005

(22) PCT Filed: Nov. 18, 2005

(86) PCT No.: PCT/DE2005/002079

§ 371 (c)(1),
(2), (4) Date: May 23, 2007

(87) PCT Pub. No.: WO2006/056170

PCT Pub. Date: Jun. 1, 2006

(65) Prior Publication Data

US 2008/0078604 A1    Apr. 3, 2008

(30) Foreign Application Priority Data

Nov. 24, 2004    (DE) ................ 10 2004 056 800

(51) Int. Cl.
*H01H 9/06*    (2006.01)
(52) U.S. Cl. .................................. 200/61.88
(58) Field of Classification Search ........... 200/61.88
See application file for complete search history.

(56) References Cited

U.S. PATENT DOCUMENTS

| | | | |
|---|---|---|---|
| 3,331,972 A | 7/1967 | Moller | |
| 4,500,867 A * | 2/1985 | Ishitobi et al. | 338/128 |
| 4,519,266 A | 5/1985 | Reinecke | |
| 4,660,430 A * | 4/1987 | Bortfeld et al. | 74/335 |
| 4,712,420 A | 12/1987 | Johansson et al. | |
| 4,733,214 A | 3/1988 | Andresen | |
| 5,850,142 A | 12/1998 | Rountos et al. | |
| 6,501,458 B2 * | 12/2002 | Baker et al. | 345/161 |
| 2002/0003527 A1 | 1/2002 | Baker et al. | |
| 2002/0139212 A1* | 10/2002 | DeJonge | 74/473.3 |
| 2002/0175060 A1 | 11/2002 | Zapf et al. | |

FOREIGN PATENT DOCUMENTS

| | | |
|---|---|---|
| DE | 196 39 200 C1 | 12/1997 |
| DE | 197 49 330 A1 | 5/1999 |
| DE | 197 49 330 C2 | 5/1999 |
| DE | 198 06 529 A1 | 8/1999 |
| DE | 101 10 738 C1 | 11/2002 |
| EP | 0 617 260 B1 | 9/1994 |
| FR | 2 768 824 | 3/1999 |

* cited by examiner

*Primary Examiner*—Michael A Friedhofer
*Assistant Examiner*—Lheiren Mae A Caroc
(74) *Attorney, Agent, or Firm*—McGlew and Tuttle, P.C.

(57) ABSTRACT

A shifting device for a motor vehicle is provided with a bracket (3), with a selector lever (7) mounted at the bracket (3) pivotably via a joint (12) and with an angle-measuring device having a signal transmitter (13) and two sensors (14, 15). The angle-measuring device is arranged in the joint (12) and is electrically connected to a control means (19) connected to a motor vehicle transmission (21).

17 Claims, 4 Drawing Sheets

SHIFTING DEVICE FOR A MOTOR VEHICLE

CROSS REFERENCE TO RELATED APPLICATIONS

This application is a United States National Phase application of International Application PCT/DE2005/002079 and claims the benefit of priority under 35 U.S.C. §119 of German Patent Application DE 10 2004 056 800.6 filed Nov. 24, 2004, the entire contents of which are incorporated herein by reference.

FIELD OF THE INVENTION

The present invention pertains to a shifting device for a motor vehicle, with a bracket, a selector lever, which is mounted at the bracket pivotably via a joint, and with an angle-measuring device having a signal transmitter and two sensors.

BACKGROUND OF THE INVENTION

The hitherto usual gear selector lever shift position recognition by means of position sensors, e.g., according to the Hall principle, is inflexible concerning the currently common guiding of the selector lever in a plurality of shift gates and intermediate positions. One sensor is frequently provided for each selector lever position, and the presence of a large number of sensors leads to higher costs and reduced reliability.

A shift detection device with a shifting means, a magnetic signal transmitter and with a signal reception device is known from DE 197 49 330 C2. A sensor array comprising at least two magnetoelectric converters is provided as the signal receiver, and magnetoresistive sensor elements can be used as converters. The signal transmitter, coupled with the motion of the shifting means, is a magnet, which cooperates with the magnetoresistive sensor elements, and the sensor elements are arranged in different planes that are arranged at right angles in relation to one another. The shifting means is mounted pivotably and has two lever arms on both sides of the mount, the magnet and the sensor elements being arranged in the area of a free end of one of the lever arms.

The drawback of this arrangement is that the magnet travels over a relatively great distance during the actuation of the shifting means, so that the signal receiver also must occupy a relatively large space.

SUMMARY OF THE INVENTION

The object of the present invention is to improve a shifting device of the type mentioned in the introduction such that the space necessary for installing the angle-measuring device can be reduced.

The shifting device or selector lever arrangement according to the present invention for a motor vehicle has a bracket, a selector lever mounted at the bracket pivotably via a joint and an angle-measuring device comprising a signal transmitter and two sensors, wherein the angle-measuring device is arranged in the joint and is electrically connected to a control means connected to a motor vehicle transmission.

Due to the angle-measuring device being integrated in the joint, the signal transmitter and the sensors are arranged relatively close to the pivot axis or axes of the selector lever, so that only very small paths or path changes have to be detected by the angle-measuring device. The angle-measuring device as a whole can thus have a very small and compact design. Furthermore, the joint protects the angle-measuring device against contamination.

Angle-measuring devices based on magnetic field measurement proved to have an especially low fault liability, so that the signal transmitter can be designed as a magnet and the sensors as magnetic field-sensitive sensors. However, the magnetic field-sensitive sensors are preferably designed as magnetoresistive sensors, which make possible, unlike Hall sensors, a two-point measurement, so that the circuitry can be made less complicated. Furthermore, detection of greater solid angles is regularly possible due to the use of magnetoresistive sensors than with an equal number of Hall sensors.

The two sensors may be arranged at different locations in the joint. Furthermore, the two sensors may form a right angle with one another and be arranged, e.g., crosswise or directed in an L-shaped pattern in relation to one another, the sensitive surfaces of the two sensors preferably extending at right angles to one another, so that the determination of two angles that are at right angles to one another is simplified.

It is possible to arrange the two sensors separately from one another. However, the two sensors are preferably integrated into a sensor assembly unit, as a result of which the installation effort needed for the sensors can be reduced. In particular, the sensors are now seated on a common board. The control means may also be integrated within the sensor assembly unit and optionally arranged or fixed on the board.

Any joint that makes possible the desired pivoting motions of the selector lever may be used as a joint. However, the joint is preferably designed as a ball and socket joint, so that the possible pivoting directions for the selector lever are not limited by the joint at all or are limited only slightly compared to other joints. The ball and socket joint may have a housing fastened to the selector lever and a joint ball fastened to the bracket and arranged in the housing, so that the housing is pivotable about the joint ball together with the selector lever. However, it is also possible that the housing is provided at the bracket, and the joint ball, which is mounted pivotably in the housing, is provided at the selector lever.

The sensors may be provided in the joint ball and the signal transmitter in the housing. However, the sensors are preferably arranged in the housing and the signal transmitter in the joint ball, which may have for this purpose a recess, in which the signal transmitter is seated. Furthermore, the bracket may be made in one piece with the joint ball and may be, e.g., a steel carrier.

The joint ball may consist of a ferromagnetic material. It is favorable in this case to embed the signal transmitter seated in the joint ball in a non-magnetic material, e.g., aluminum. The properties of the magnetic field concerning signal detection are favorably affected hereby if the signal transmitter is a magnet or a permanent magnet.

To fix or preset the possible motions of the selector lever, a gear shifting gate with one or more shift gates may be provided, through which the selector lever extends and along which the selector lever can be moved. The gear shifting gate is preferably connected now directly or indirectly to the bracket or is fixed to same. In particular, all the selector lever positions preset by the shift gates of the gear shifting gate including all intermediate positions are located within the detection range of the angle-measuring device or the sensors, so that all intermediate positions of the angle-measuring device can also be determined, besides the preset selector lever positions. For simpler operation, the selector lever may have a free end, to which a shift knob is fastened.

The motor vehicle transmission can be put, in particular, into different shift states, the control means electrically connected to the sensors being able to evaluate the electric signals sent by the sensors and to put the transmission into different shift states as a function of this evaluation. Since the distance between the sensors, on the one hand, and the signal transmitter, on the other hand, is an indicator of the position of the selector lever in space, the current position of the selector lever is determined by the evaluation. This evaluation takes place especially continuously or quasi-continuously. Furthermore, it is possible to determine not only the absolute position of the selector lever in space but also the velocity at which the selector lever is moved by the user. The control means may have, e.g., an analog or digital differentiator for this, which determines the velocity of the selector lever by a time derivation of the space or angular coordinates of the selector lever, which are determined by the evaluation.

The basic object of the present invention is accomplished, furthermore, by a motor vehicle with a shifting device according to the present invention, wherein the bracket is fastened to the motor vehicle and to the vehicle body, especially in the interior of the motor vehicle, e.g., in the passenger compartment. The shifting device may be varied according to all the aforementioned embodiments. Furthermore, it is possible to couple the control means with an engine-transmission control or to integrate it in same.

The present invention pertains, furthermore, to the use of a shifting device according to the present invention for actuating the transmission, which is arranged in a motor vehicle and can be put into different shift states, wherein the sensors cooperate with the signal transmitter and send electric signals to the control means and wherein the electric signals are evaluated by the control means at a selector lever position, wherein the transmission is put into one of the shift states as a function of the selector lever position. The shifting device may be varied according to all the aforementioned embodiments.

Furthermore, as was briefly mentioned above, the velocity of actuation of the selector lever can be determined during the actuation of the selector lever by the control means differentiating in time the space or angular coordinates of the selector lever, which are determined, e.g., continuously or quasi-continuously.

The position of the selector lever and hence the driver's command for the transmission are determined by means of the integration of an intelligent angle sensor system in the joint, especially a ball and socket joint, with which the gearshift lever or selector lever of the transmission is mounted. For example, the direction of the lines of flux of the signal transmitter designed as a calibrated magnet in the bracket designed as a steel carrier relative to the sensor assembly unit or the sensors is measured in case of the magnetoresistive principle of measurement, so that the detection of a relative rotation between the magnet and the sensor assembly unit or sensors is possible in a broad range of angles with high resolution. The intelligent angle joint can be formed by integrating the sensor system with different types of joints.

The position of the selector lever can be determined in a flexible manner in a surface defined by two coordinates, so that two cardanic angles of the ball and socket joint can be simultaneously detected by the sensor system. The signal evaluation and the shift position recognition is carried out by the control means, which is arranged in the joint or outside the joint, e.g., as an externally arranged electronic module for signal field processing based on a characteristic mapping.

To implement individual shift patterns, in which different stable and unstable gearshift lever positions—i.e., also intermediate positions—shall be approached and recognized, the gearshift lever position is preferably detected continuously and in a correspondingly broad range of angles. Novel shift patterns provide, for example, for a change from one gate to another (two gate) even in the automatic range alone (hitherto one gate) to avoid a jumping over of step P (Park) during the shifting from D (Drive) to R (Reverse), which leads to an advantage in terms of safety of operation. It would also be possible to add an auxiliary manual gate (altogether 3 gates) to this, which results in a complex guiding of the selector lever.

The velocity of actuation of the selector lever can be additionally outputted, especially as an electric signal, by integrated numeric or analog differentiation for adaptive purposes for the engine-transmission control or further drive and chassis control systems, e.g., by the control means.

Besides the greater flexibility in case of a complete gear shifting gate design, advantages in terms of both costs and reliability can be obtained with only two integrated sensors or an integrated sensor assembly unit for detecting all two-dimensional selector lever positions. Gearshift lever motions, which are not guided in space, and which can be detected with conventional position sensor systems with difficulty only, but without problems with the shifting device according to the present invention, are conceivable for novel shift-by-wire systems. The determination of the position can be determined continuously in a defined field by means of two sensors arranged at the ball or in the housing at right angles to one another.

It is thus possible to form an "intelligent" joint, in which the angle-measuring device is integrated in the joint, optionally together with the control means, which can determine not only the location of the selector lever but also the velocity of motion of the selector lever, e.g., by numeric differentiation. Additional signals describing the shifting dynamics can thus be used for adapting the transmission control, e.g., for sport or comfort operation.

The present invention will be described below on the basis of a preferred embodiment with reference to the drawings. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
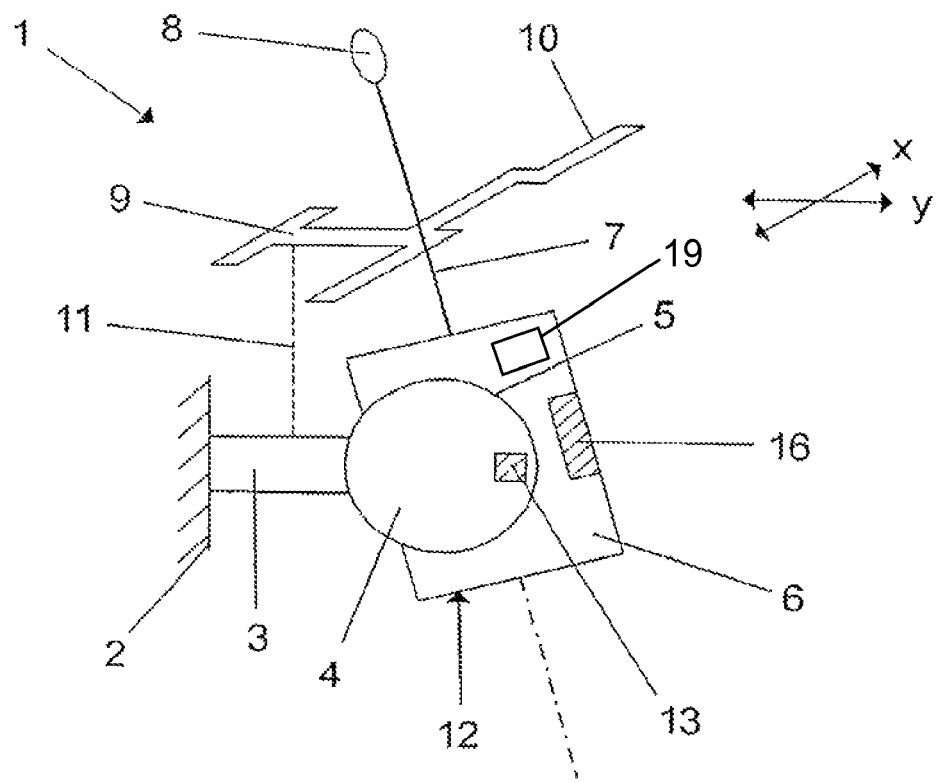
FIG. 1 is a schematic view of an embodiment of the selector lever arrangement according to the present invention.

Referring to the drawings in particular, FIG. 1 shows an embodiment of the selector lever arrangement according to the present invention, which is designated as a whole by reference number 1. A bracket 3, which is designed as a steel carrier and to which a joint ball 4 is in turn fixed, is fastened to a motor vehicle 2, which is shown schematically. The joint ball 4 is mounted in a spherical recess 5 of a housing 6 such that the housing can pivot about the joint ball 4. A selector lever 7 is fastened to the housing 6, and a shift knob 8 is attached to the end of the selector lever that faces away from the housing 6. The selector lever 7 extends through shift gates 9 of a gear shifting gate 10, the selector lever 7 being movable along the shift gates 9. It is indicated by a broken line 11 that the gear shifting gate 10 is fastened to the bracket 3. The gear shifting gate 10 thus limits the space of motions of the selector lever 7 to motions within the shift gates 9.

Without a gear shifting gate 10, the selector lever 7 would be freely movable along the directions characterized by x and y, but the design embodiment of the ball and socket joint 12 formed by the joint ball 4 and the housing 6 limits the space of motions of the selector lever 7 in this case as well.

A permanent magnet 13, whose magnetic field cooperates with two sensors 14 and 15 (see FIG. 5), which are integrated into a sensor assembly unit 16 and are arranged in the housing 6, is arranged in the joint ball 4. The two sensors 14 and 15 are designed as magnetoresistive sensors.

Figure 2:
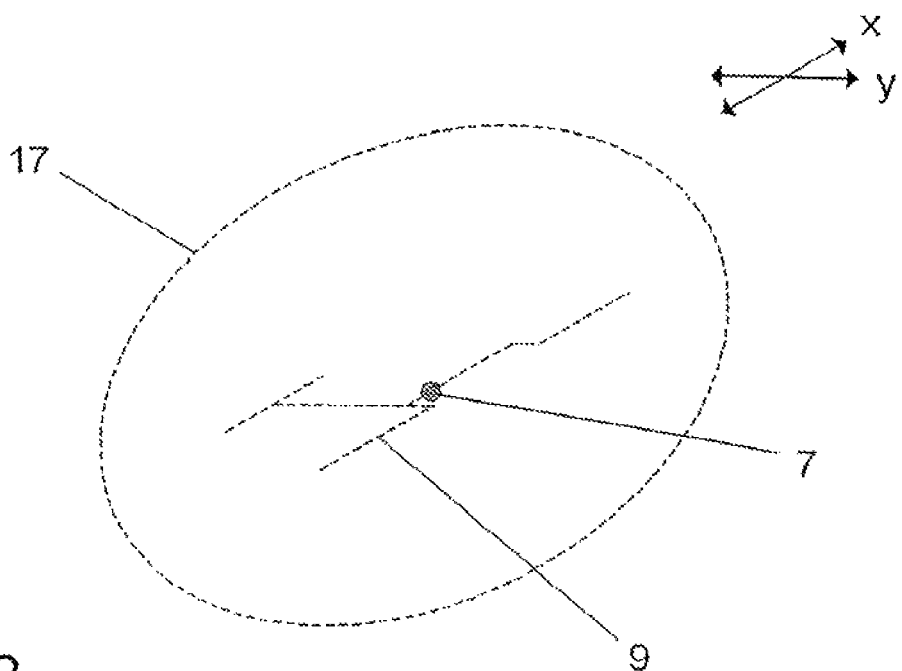
FIG. 2 is a schematic view of the measuring range of the embodiment according to FIG. 1.

FIG. 2 shows a schematic view of the space of motions of the selector lever 7, which can move along the shift gate 9 indicated by broken line. The space of motions is located entirely within the measuring range 17 of the angle-measuring device or the sensors 14 and 15, so that each position of the selector lever in the shift gates 9 can be unambiguously detected by the sensors 14 and 15. The measuring range 17 already takes into account the distance between the gear shifting gate 10 and the ball and socket joint 12 in this case. The position of the selector lever is determined now such that the sensors 14 and 15 have different distances from the magnet 13 in different positions of the selector lever and are thus also located at different locations of the magnetic field generated by the magnet. The sensors 14 and 15 thus furnish different electric signals for different selector lever positions, and the position of the selector lever can be unambiguously determined on the basis of these signals. One possibility of evaluation is, e.g., that the control means compares the signals sent by the sensors with pattern signals stored in a memory, which were determined beforehand for each gearshift lever position.

Figure 3:
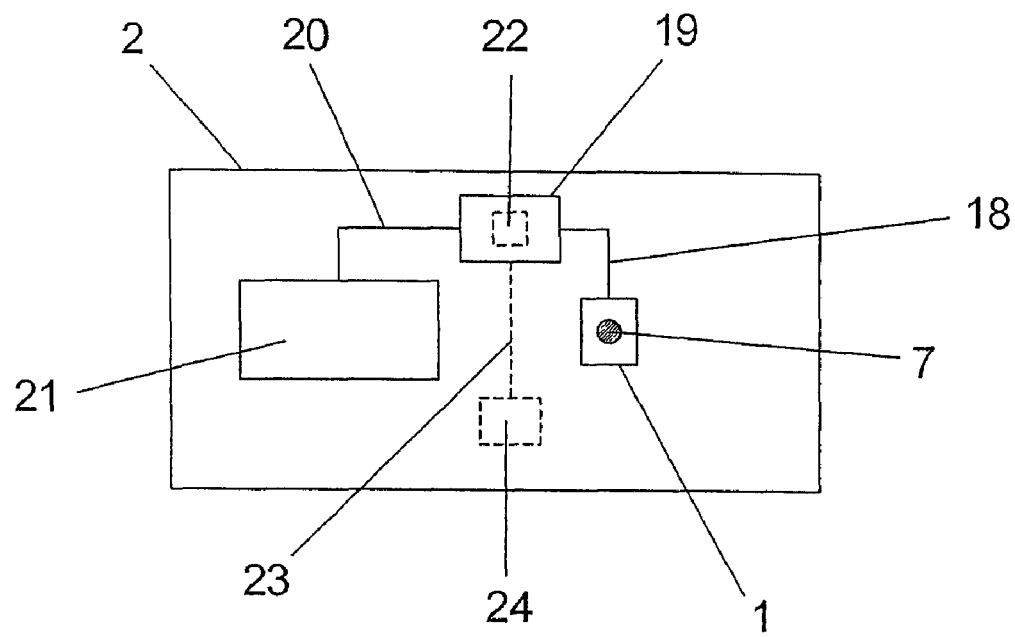
FIG. 3 is a schematic view of a motor vehicle with the selector lever arrangement according to the present invention.

FIG. 3 shows a schematic view of the motor vehicle 2, which has a control means 19, which is electrically connected to the sensors 14 and 15 via electric lines 18 and which is in turn connected via a connection 20 to a transmission 21, which is arranged in the motor vehicle 2 and can be put into a plurality of shift positions. If the transmission 21 has an adjusting device that can be actuated electronically, the connection 20 may be formed by electric lines. If the transmission 21 is adjustable only mechanically, the connection 20 may also be formed by a mechanical adjusting device, which can be actuated by an actuator, which is formed especially in the control means 19.

The control means 19 can assign the electric signals sent by the sensors 14 and 15 to different selector lever positions and put the transmission 21 into a certain shift state via the connection 20 according to the selector lever position determined. Furthermore, the control means 19 may have a differentiator 22, which can derive the continuously or quasi-continuously determined position or angle signals, which represent the position of the selector lever 7, in order to thus determine the velocity at which the selector lever 7 is or was actuated. The data or electric signals representing the velocity of the selector lever can then be sent to an engine-transmission control 24 via an electric line 23.

Figure 4:
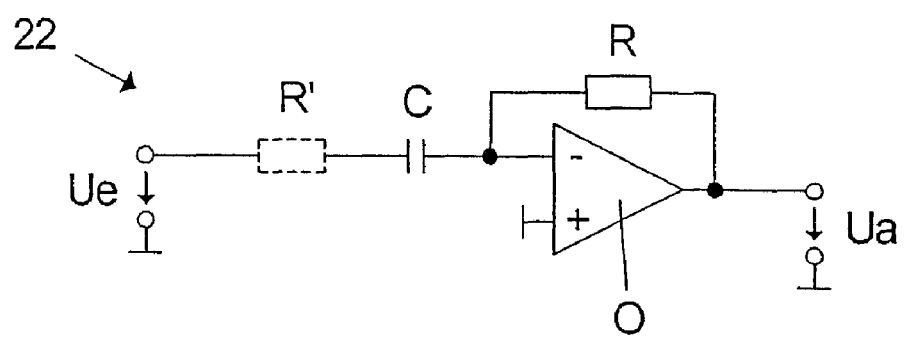
FIG. 4 shows a schematic block diagram of an analog differentiator.

FIG. 4 shows a schematic block diagram of such a differentiator, where the time derivative of the input voltage Ue is proportional to the output voltage Ua. In particular, $$Ua = -RC\frac{dUe}{dt}$$

for frequencies $$f << \frac{1}{2\pi R'C}$$

The voltage Ue represents the location or the angle of the selector lever or the selector lever position, whereas the voltage Ua represents the velocity at which the selector lever is actuated. It is, of course, also possible to use a digital processor for the numeric differentiation. The differentiator 22 has a digital design in this case and has, e.g., a digital signal processor. In particular, a separate differentiator may be provided for each sensor.

Figure 5:
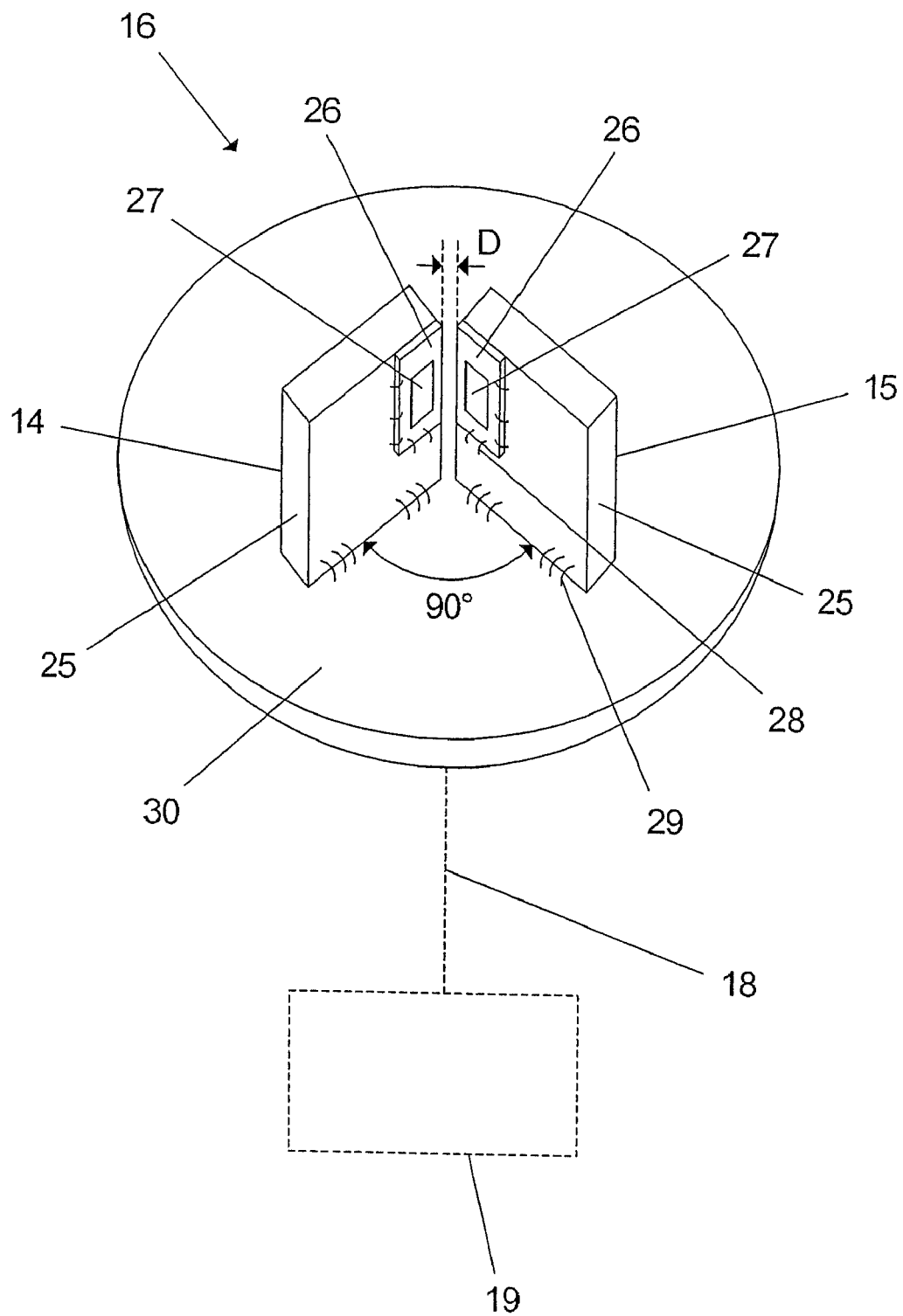
FIG. 5 shows a schematic view of the sensor assembly unit according to FIG. 1.

FIG. 5 shows a schematic view of the sensor assembly unit 16, the two sensors 14 and 15 having each a sensor carrier 25 and a sensor element 26 with a sensitive surface 27. The two sensor carriers 25 are arranged at a distance D of, e.g., 0.3 mm from each other, and form an angle of 90 with one another. However, it is also possible to reduce the distance D to 0 mm. Furthermore, the sensitive surfaces 27 of the sensor elements 26 form right angles with one another, or, in other words, the two sensitive surfaces 27 are located on planes that form right angles with one another.

Via electric contacts 28, the sensor elements 26 are connected to the respective sensor carrier 25, which is connected via electric contacts 29 to a board or printed circuit board 30, on which the two sensor carriers 25 are seated.

Furthermore, the electric lines 18, which extend to the control means 19, which may likewise be integrated in the sensor assembly unit 16, are connected to the printed circuit board 30. The lines 18 may be designed in the latter case as strip conductors on or in the board 30.

Figure 6:
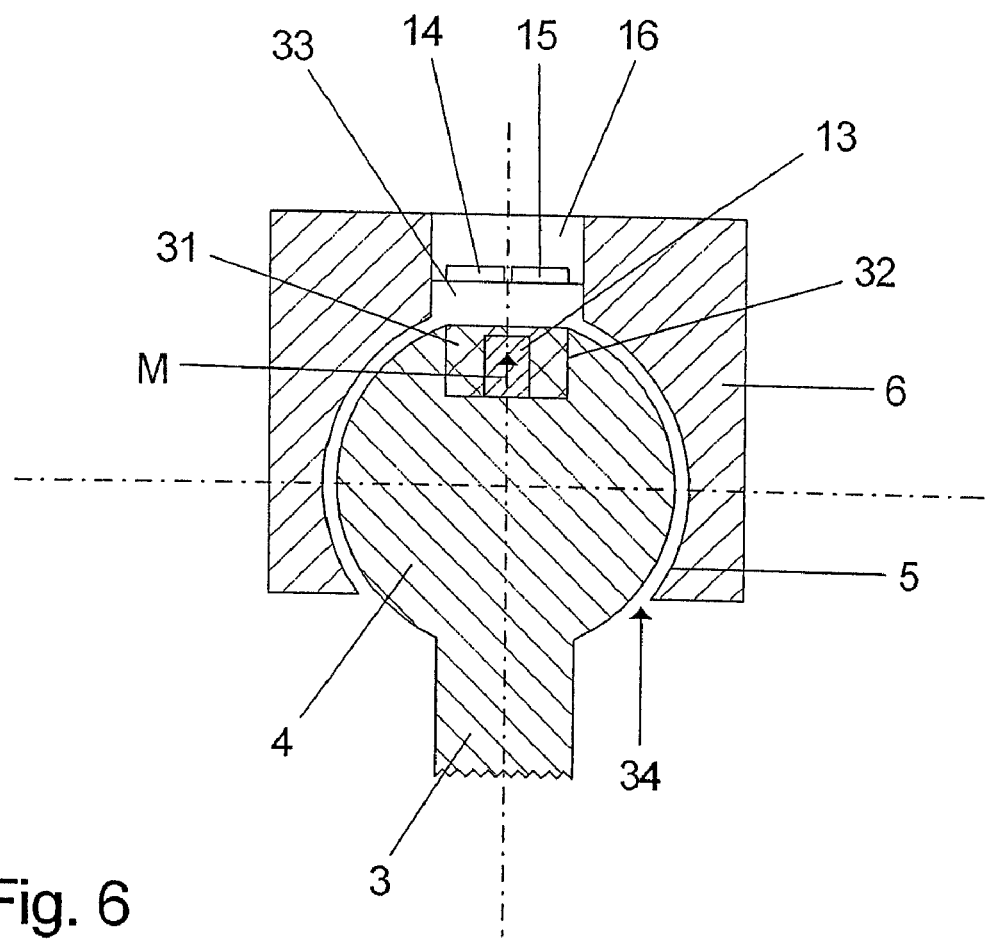
FIG. 6 shows a partially cut-away view of the embodiment.

FIG. 6 shows a partially cut-away view of the embodiment in which the magnet 13, whose magnetization is designated by M, is embedded in a non-magnetic material 31 and is seated in a recess 32 provided in the joint ball 4. Furthermore, the sensor assembly unit 16 is arranged in a recess 33 provided in the housing 6. The ball pivot formed from the joint ball 4 and the bracket 3 extends out of the housing 6 through a housing opening 34, and the joint ball 4 is made especially in one piece with the bracket 3 according to this embodiment.

While specific embodiments of the invention have been shown and described in detail to illustrate the application of the principles of the invention, it will be understood that the invention may be embodied otherwise without departing from such principles.

The invention claimed is:

1. A shifting device for a motor vehicle, the shifting device comprising:
   a bracket;
   a joint, said joint being a ball and socket joint;
   a selector lever mounted at said bracket pivotably via said joint;
   a control means connected to a motor vehicle transmission; and
   an angle-measuring device having a signal transmitter and two sensors, said angle-measuring device being arranged in said joint and being electrically connected to said control means, wherein said ball and socket joint has a housing fastened to said selector lever and a joint ball, which is fastened to said bracket and is mounted in said housing, wherein said housing is pivotable about said joint ball together with said selector lever.

2. A shifting device in accordance with claim 1, wherein said signal transmitter is a magnet and said sensors are magnetic field-sensitive sensors.

3. A shifting device in accordance with claim 2, wherein said sensors are magnetoresistive sensors.

4. A shifting device in accordance with claim 1, wherein said two sensors are directed at right angles to one another.

5. A shifting device in accordance with claim 1, wherein said two sensors are integrated in a sensor assembly unit.

6. A shifting device in accordance with claim 1, wherein a gear shifting gate with one or more said shift gate portions, through which said selector lever extends and along which said selector lever can be moved, is directly or indirectly connected to said bracket.

7. A shifting device in accordance with claim 1, wherein said selector lever has a free end, to which a shift knob is fastened.

8. A shifting device in accordance with claim 1, wherein said transmission can be put into different shift states, wherein electric signals sent by said sensors are evaluated by said control means, which is electrically connected to said sensors, and said transmission can be put into different shift states as a function of this evaluation by said control means.

9. A shifting device in accordance with claim 1, wherein said control means has a differentiator.

10. A shifting device in accordance with claim 1, wherein said control means is arranged in said joint.

11. A motor vehicle combination comprising:
a motor vehicle with a motor vehicle transmission; and
a shifting device, comprising a bracket, a ball and socket joint, a selector lever mounted at said bracket pivotably via said ball and socket joint, a control means connected to a motor vehicle transmission and an angle-measuring device having a signal transmitter and two sensors, said angle-measuring device being arranged in said ball and socket joint and being electrically connected to said control means, said bracket being fastened to said motor vehicle, said ball and socket joint comprising a housing and a joint ball mounted in said housing, said housing being fastened to said selector lever, said joint ball being fastened to said bracket, wherein said housing is pivotable about said joint ball together with said selector lever.

12. A motor vehicle combination in accordance with claim 11, wherein said selector lever is arranged in the interior of said motor vehicle.

13. A motor vehicle in accordance with claim 11, further comprising an engine-transmission control wherein said control means is integrated within said engine-transmission control.

14. A shifting device process for actuating said transmission, the process comprising the steps of:
providing a transmission arranged in a motor vehicle, which transmission can be put into different shift states;
providing a shifting device including a bracket, a ball and socket joint comprising a housing and a joint ball mounted in said housing, a selector lever mounted at said bracket pivotably via said ball and socket joint, a control means connected to a motor vehicle transmission, and an angle-measuring device having a signal transmitter and two sensors, said housing being fastened to said selector lever, said joint ball being fastened to said bracket, said housing being pivotable about said joint ball together with said selector lever, said angle-measuring device being arranged in said ball and socket joint and being electrically connected to said control means wherein said sensors cooperate with said signal transmitter and send electric signals to said control means;
determining a selector lever position by said control means by evaluating the electric signals to place said transmission into one of the shift states by said control means as a function of the position of the selector lever.

15. A shifting device process in accordance with claim 14, wherein said selector lever is actuated and the velocity at which said selector lever is actuated is determined by said control means by analog or numeric differentiation of signals assigned to the selector lever positions.

16. A shifting device for a motor vehicle, the shifting device comprising:
a bracket;
a joint, said joint being a ball and socket joint;
a selector lever mounted at said bracket pivotably via said joint;
a control means connected to a motor vehicle transmission; and
an angle-measuring device having a signal transmitter and two sensors, said angle-measuring device being arranged in said joint and being electrically connected to said control means, said ball and socket joint having a housing fastened to said selector lever and a joint ball, which is fastened to said bracket and is mounted in said housing, wherein said housing is pivotable about said joint ball together with said selector lever, said signal transmitter being arranged in said joint ball and said sensors being arranged in said housing.

17. A shifting device for a motor vehicle, the shifting device comprising:
a bracket;
a joint, said joint being a ball and socket joint;
a selector lever mounted at said bracket pivotably via said joint;
a control means connected to a motor vehicle transmission; and
an angle-measuring device having a signal transmitter and two sensors, said angle-measuring device being arranged in said joint and being electrically connected to said control means, said ball and socket joint having a housing fastened to said selector lever and a joint ball, which is fastened to said bracket and is mounted in said housing, wherein said housing is pivotable about said joint ball together with said selector lever, said signal transmitter being arranged in said joint ball and said sensors being arranged in said housing, said joint ball comprising a ferromagnetic material and said joint ball having a recess, in which said signal transmitter is seated, which is embedded in a non-magnetic material.

* * * * *